(12) United States Patent
Ware et al.

(10) Patent No.: US 10,108,488 B2
(45) Date of Patent: *Oct. 23, 2018

(54) MEMORY MODULE WITH INTEGRATED ERROR CORRECTION

(71) Applicant: Rambus Inc., Sunnyvale, CA (US)

(72) Inventors: Frederick A. Ware, Los Altos Hills, CA (US); Scott C. Best, Palo Alto, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/254,431

(22) Filed: Sep. 1, 2016

(65) Prior Publication Data

US 2017/0102992 A1 Apr. 13, 2017

Related U.S. Application Data

(63) Continuation of application No. 14/475,619, filed on Sep. 3, 2014, now Pat. No. 9,450,614.

(60) Provisional application No. 61/937,285, filed on Feb. 7, 2014, provisional application No. 61/877,354, filed on Sep. 13, 2013.

(51) Int. Cl.
*G06F 11/10* (2006.01)
*H03M 13/15* (2006.01)
*H03M 13/00* (2006.01)
*H03M 13/19* (2006.01)
*G06F 11/08* (2006.01)

(52) U.S. Cl.
CPC ..... *G06F 11/1048* (2013.01); *H03M 13/1525* (2013.01); *H03M 13/19* (2013.01); *H03M 13/617* (2013.01)

(58) Field of Classification Search
CPC ........... H03M 13/1525; H03M 13/617; H03M 13/151; H03M 13/15; H03M 13/19; G06F 11/1048; G06F 11/1076; G06F 11/008
See application file for complete search history.

(56) References Cited

U.S. PATENT DOCUMENTS

| | | | |
|---|---|---|---|
| 4,646,312 A | 2/1987 | Goldbury et al. |
| 5,206,865 A | 4/1993 | Gruender, Jr. et al. |
| 5,291,498 A | 3/1994 | Jackson et al. |
| 5,987,627 A | 11/1999 | Rawlings, III |
| 6,185,718 B1 | 2/2001 | Dell et al. |
| 6,490,703 B1 | 12/2002 | de la Iglesia et al. |
| 6,802,040 B1 | 10/2004 | Ohyama et al. |

(Continued)

OTHER PUBLICATIONS

"Error Detection and Correction," Definition retrieved Sep. 23, 2013 from http://en.wikipedia.org/w/index.php?oldid=569881425. 8 pages.

(Continued)

*Primary Examiner* — April Y Blair
*Assistant Examiner* — Dipakkumar Gandhi
(74) *Attorney, Agent, or Firm* — Silicon Edge Law Group LLP; Arthur J. Behiel

(57) ABSTRACT

A memory system includes a memory module that supports error detection and correction (EDC) in a manner that relieves a memory controller or processor of some or all of the computational burden associated with EDC. Individual EDC components perform EDC functions on subsets of the data, and share data between themselves using relatively short, fast interconnections.

14 Claims, 5 Drawing Sheets

(56) References Cited

U.S. PATENT DOCUMENTS

| | | | |
|---|---|---|---|
| 7,219,182 B2 | 5/2007 | Byers et al. | |
| 7,386,765 B2 | 6/2008 | Ellis et al. | |
| 7,487,428 B2 | 2/2009 | Co et al. | |
| 8,086,936 B2 | 12/2011 | Gower et al. | |
| 8,386,833 B2 | 2/2013 | Smith et al. | |
| 9,450,614 B2* | 9/2016 | Ware | H03M 13/1525 |
| 2005/0081085 A1 | 4/2005 | Ellis et al. | |
| 2008/0022186 A1 | 1/2008 | Co et al. | |
| 2009/0063923 A1 | 3/2009 | Gower et al. | |
| 2010/0162037 A1 | 6/2010 | Maule et al. | |
| 2011/0138249 A1* | 6/2011 | Kern | G01L 9/0052 |
| | | | 714/755 |
| 2011/0154157 A1* | 6/2011 | Naeimi | H03M 13/2906 |
| | | | 714/758 |
| 2012/0005559 A1 | 1/2012 | Jeong et al. | |
| 2012/0042204 A1 | 2/2012 | Smith et al. | |
| 2012/0066432 A1 | 3/2012 | Miura | |
| 2012/0204079 A1 | 8/2012 | Takefman et al. | |
| 2012/0246540 A1* | 9/2012 | Lee | G06F 12/0246 |
| | | | 714/758 |
| 2012/0266041 A1 | 10/2012 | Wang et al. | |
| 2013/0003480 A1 | 1/2013 | D'Abreu et al. | |
| 2013/0058145 A1 | 3/2013 | Yu et al. | |

OTHER PUBLICATIONS

Dell, Timothy J., "ECC-on-SIMM Test Challenges," International Test Conference 1994, IEEE, Paper 22.1, pp. 511-515. 5 pages.

Kent, Dean, "Parity and ECC—How They Work: The Need for Error Checking," Jun. 13, 2000. 4 pages.

Key, J.D., "Some Error-Correcting Codes and their Applications," Chapter 14 of Applied Mathematical Modeling: A Multidisciplinary Approach, 1999. 22 pages.

Locklear, David, "Chipkill Correct Memory Architecture," Aug. 2000, Technology Brief, Dell. 4 pages.

\* cited by examiner

MEMORY MODULE WITH INTEGRATED ERROR CORRECTION

BACKGROUND

"Soft errors" in electronic circuitry are signals that represent erroneous data, but not due to an error in the design or operation of the circuitry. For example, electrical or magnetic interference inside a computer system can cause a single bit of dynamic random-access memory (DRAM) to spontaneously flip to the opposite state.

DRAM is ubiquitous in personal computers, workstations, and servers, and is normally included on one or more memory modules. Memory modules take many forms, but each includes a number of individual DRAM components mounted on a printed-circuit board (PCB). Some DRAM modules include extra storage for "syndromes," information calculated for each unit of stored data and used in support of error-correcting codes (ECC). Depending on the code, the syndromes may support single- or multi-bit correction, or even accommodate the loss of an entire memory component.

DRAM modules may provide the stored syndromes with the corresponding data to a memory controller that performs the error correction. Memory controllers with error-correction capability are relatively expensive, however. Though less common, memory modules may themselves include circuitry that performs error correction, and thus allows them to be used with less expensive memory controllers. Module-based error-correction is expensive, however, and can introduce considerable and undesirable read and write delays. There is therefore a need for fast and economical correction for soft errors.

BRIEF DESCRIPTION OF THE FIGURES

The figures are illustrations by way of example, and not by way of limitation. Like reference numerals in the figures refer to similar elements.

DETAILED DESCRIPTION

Figure 1:
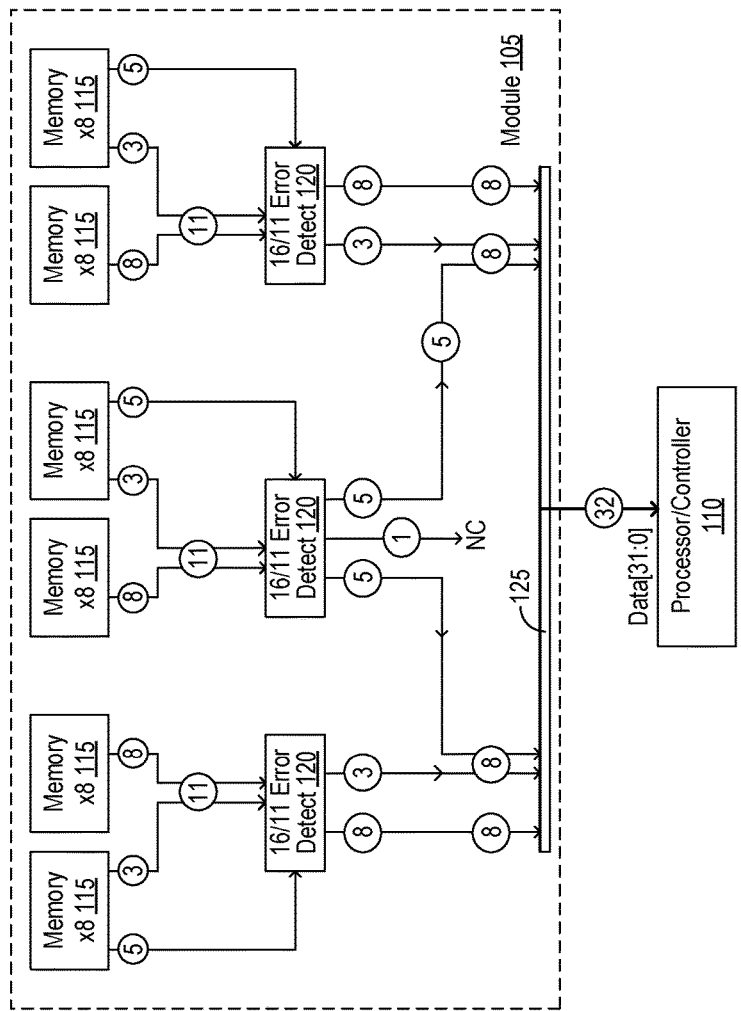
FIG. 1 depicts a memory system 100 in which a memory module 105 supports error detection and correction (EDC) in a manner that relieves a memory controller or processor 110 of some or the entire computational burden associated with EDC.

FIG. 1 depicts a memory system 100 in which a memory module 105 supports error detection and correction (EDC) in a manner that relieves a memory controller or processor 110 of some or all of the computational burden associated with EDC. Memory module 105 can thus be used in support of relatively inexpensive, non-EDC memory controllers. The workings of components like controller or processor 110 that communicate read and write data with memory modules are well known to those of skill in the art. A detailed discussion of processor or controller 110 is therefore omitted.

Module 105 includes six memory components 115, three error-detection components 120, and a module connector 125. Components 115 and 120 are discrete integrated-circuit (IC) devices disposed upon and interconnected via a printed-circuit (PC) board. Memory components 115 store and communicate data signals and syndrome signals to error-detection components 120. Each component 120 includes a module interface coupled to module connector 125 via either ten or eleven of thirty-two data paths. Each component 120 also includes a memory-component interface coupled to a pair of memory components 115 to receive respective subsets of the data and syndrome signals, eleven parallel data bits and five parallel syndrome bits in this example. Memory components 115 deliver eight-bit-wide data, or "by-eight data," and at least some of components 115 deliver both data and syndrome bits. By-eight memory components are commonly available but other data widths might also be used.

Error-detection components 120 each include syndrome logic that supports a 16/11 error-correcting code—for example, an extended Hamming code—capable of detecting any two-bit error in an eleven-bit subset of the data signals, and of correcting any single-bit error in the same subset. Hamming codes and other forms of error detection and correction are well known to those of skill in the art, and the idea described herein is not limited to a single specific code. A detailed discussion of the workings of components 120 is therefore omitted for brevity. Each error-detection component 120 includes error-correction logic in this embodiment, but other examples may only detect errors.

Module 105 supplies EDC for thirty-two bit data Data [31:0] on a like-identified data bus using the 16/11 Hamming code. As detailed below, this configuration requires fifteen additional syndrome bits, five for each component 120, for a total width of forty-seven (32+15) bits. Six by-eight memory devices 115 provide a total width of forty-eight bits, just one more than the requisite forty-seven.

Each of components 120 has a first eleven-bit interface that communicates potentially erroneous data from two memories 115, a second eleven-bit interface that communicates error-free data to module connector 125, and a five-bit syndrome interface that reads syndrome bits from e.g. one of memories 115. Connector 125 only supports 32 data pins (not shown) in this example, so one node of the center component 120 is not connected. This additional bit may be used for some other purpose.

Providing fewer error-detection components to serve wider data, and thus a greater number of memory components, requires fewer syndrome bits than does the example of FIG. 1. For example, a single Hamming code can provide error detection and correction for the entire thirty-two bit data Data[31:0] of FIG. 1 using just six syndrome bits, a savings of nine bits when compared with the depicted embodiment. Reducing the number of syndrome bits by nine would reduce the requisite number of memory components 115 from six to five. However, the error-detection logic in such a module can require data and syndrome signals to traverse greater distances across module 105, and thus suffer greater delays and concomitant reductions in memory speed performance. This benefit becomes more important with wider data widths, a point that is better illustrated in connection with the following embodiments.

Figure 2:
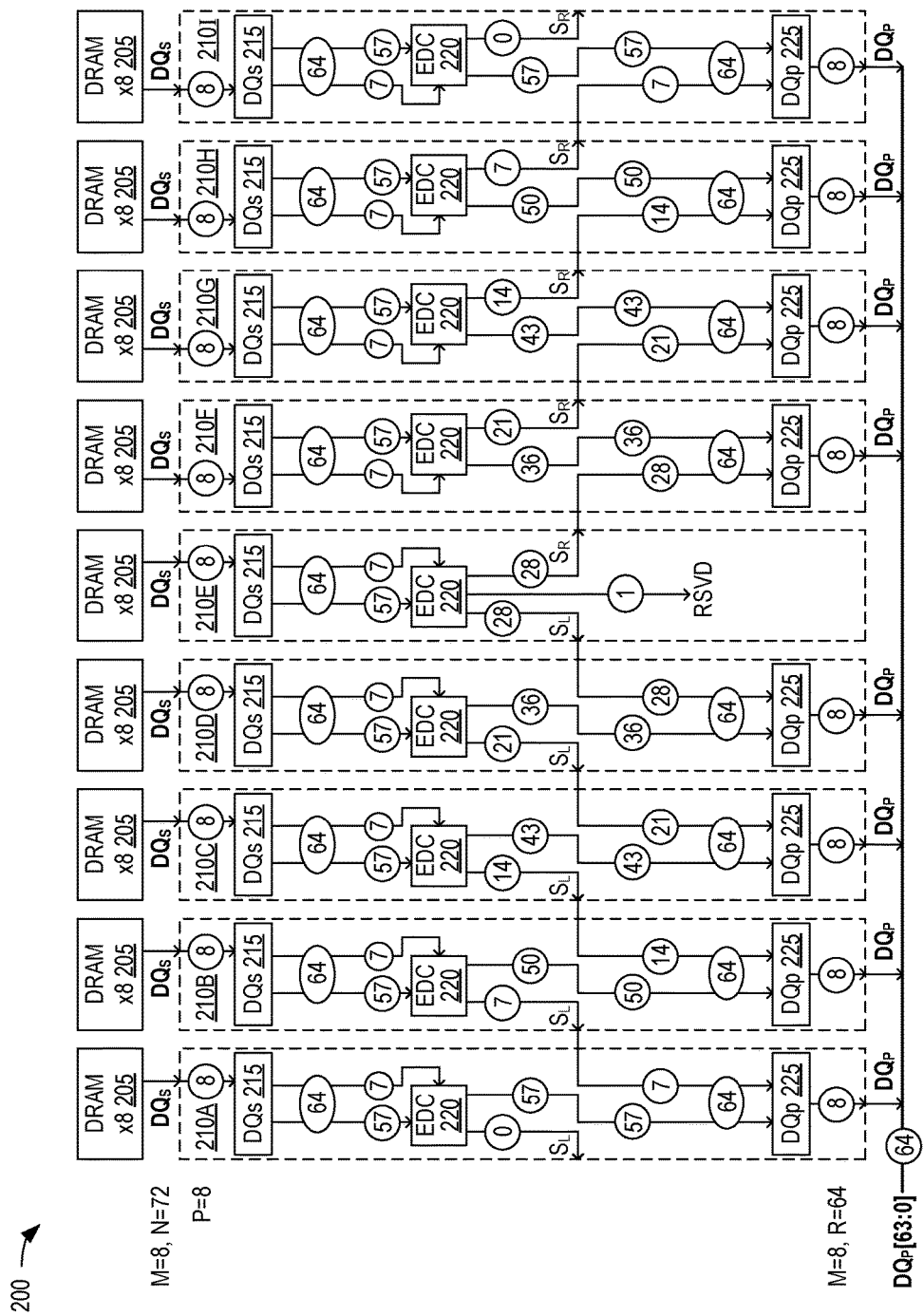
FIG. 2 details an EDC memory module 200 in accordance with an embodiment that communicates eight-bit bursts of sixty-four bit data, or 512-bits total, via a module connector $DQ_P[6:0]$.

FIG. 2 details an EDC memory module 200 in accordance with an embodiment that communicates eight-bit bursts of sixty-four bit data, or 512-bits total, via a module connector $DQ_P[63:0]$. Each of nine DRAM memory components 205 has a width P of eight (P=8) and communicates in bursts of eight (M=8). The nine DRAM therefore deliver eight seventy-two bit words (N=72) per memory transaction (a total of 576 bits). The nine by-eight DRAM memory components store the data communicated to module connector $DQ_P[63:0]$ and associated syndrome bits to detect and correct errors. The nine by-eight DRAMs provide the same effective data width as eight by-eight DRAMs without EDC. Other embodiment may use various device widths and support different burst lengths. In FIG. 2, data and syndrome flow is illustrated in the read direction only, for ease of illustration. The write direction and syndrome creation are detailed in connection with later figures.

Module 200 includes nine EDC components 210A-I, one for each memory component 205. Each EDC component 210 generates syndrome bits for storage in its respective memory component 205, and uses those syndrome bits during read transactions to both detect and correct errors. Lateral busses $S_L$ (for "shift left") and $S_R$ (for "shift right") communicate data between adjacent error-detection components 210, the resultant sharing distributing data evenly across components 210 using relatively short and therefore fast interconnections.

Error-detection components 210A-I are physically the same or similar, but the connections distributing data to adjacent EDC components and to serializers 225 vary between components. Starting at the left, component 210A includes a deserializer 215 that converts eight-bit bursts of serialized data into deserialized by-fifty-seven data by-seven syndrome signals. EDC logic 220 performs a 64/57 error-correction (e.g., using a Hamming code) function, applying the seven syndrome bits to the fifty-seven potentially erroneous data bits to produce fifty-seven bits of error-corrected data. Each of the remaining error-detection components 210B-I works in the same or a similar manner to produce fifty-seven bits of error-corrected data from its respective memory component 205.

Sixty-four data bits are required to service one eighth of a 256-bit memory transaction (256/8=64). The fifty-seven error-corrected bits from the leftmost error-detection component 210A are seven short of the requisite sixty-four, so component 210A "borrows" seven error-corrected data bits from adjacent component 210B using lateral data connections that extend between adjacent EDC components. The resultant sixty-four error-corrected bits are provided to a serializer 225, which converts the sixty-four parallel bits into a by-eight burst of eight.

Sharing seven error-corrected bits leaves component 210B fourteen bits shy of the required sixty-four. Component 210B borrows the requisite fourteen from adjacent component 210C, leaving component 210C twenty-one bits shy. Component 210D shares the twenty-one bits, and borrows twenty-eight from its other neighbor, component 210E. The components 210F-I to the right of component 210E similarly distribute error-corrected bits from central EDC component 210E so that each has the required sixty-four for each memory transaction. The central component 210E shares all but one bit reserved bit RSVD, which is available for some other purpose.

During a read transaction, a memory controller or processor (not shown) initiates a read from memory components 205 via EDC components 220. Components 220 collectively read an M-bit sequence of N-bit words (where, in FIG. 2, M is eight and N is seventy-two) from the memory components. EDC components 220 each receive a subset of the bits, and in this way divide the M-bit sequence of N-bit words into M-bit sequences of P-bit sub-words. In this example the value P is the same as the width of each memory component, but this need not be the case.

Each deserializer 215 separately deserializes the respective M-bit sequences of P-bit sub-words into a respective fifty-seven-bit data subset and a respective seven-bit syndrome. EDC 220 then corrects any errors in the data subset using the syndrome, and thereby produces an error-free data subset. Portions of the data subsets from the various components 210A-I are combined to produce sixty-four-bit data subsets, which are then serialized by serializers 225. Finally, the outputs from serializers 225 are combined into an eight-bit sequence of sixty-four bit words (R=64). Width R lacks the syndrome bits, and is therefore less than width N from memory components 205.

Some advantages of the embodiment of FIG. 2 are to be understood by comparison with other possible EDC solutions. As noted previously, each error-correction component may employ a 64/57 Hamming code that requires seven syndrome bits, and thus one extra by-eight memory device. The same 64-bit bus could be served by a 128/120 Hamming function, which requires eight syndrome bits and thus one extra by-eight memory device, just as in the example of FIG. 2. The Hamming logic in such an embodiment would require comparisons between bits from relatively distant memory devices, however, with concomitant transmission delays. Dividing the error-correcting logic among physically distributed EDC logic 220 allows for the relatively shorter and fast interconnections provided by local buses $S_L$ and $S_R$.

Figure 3:
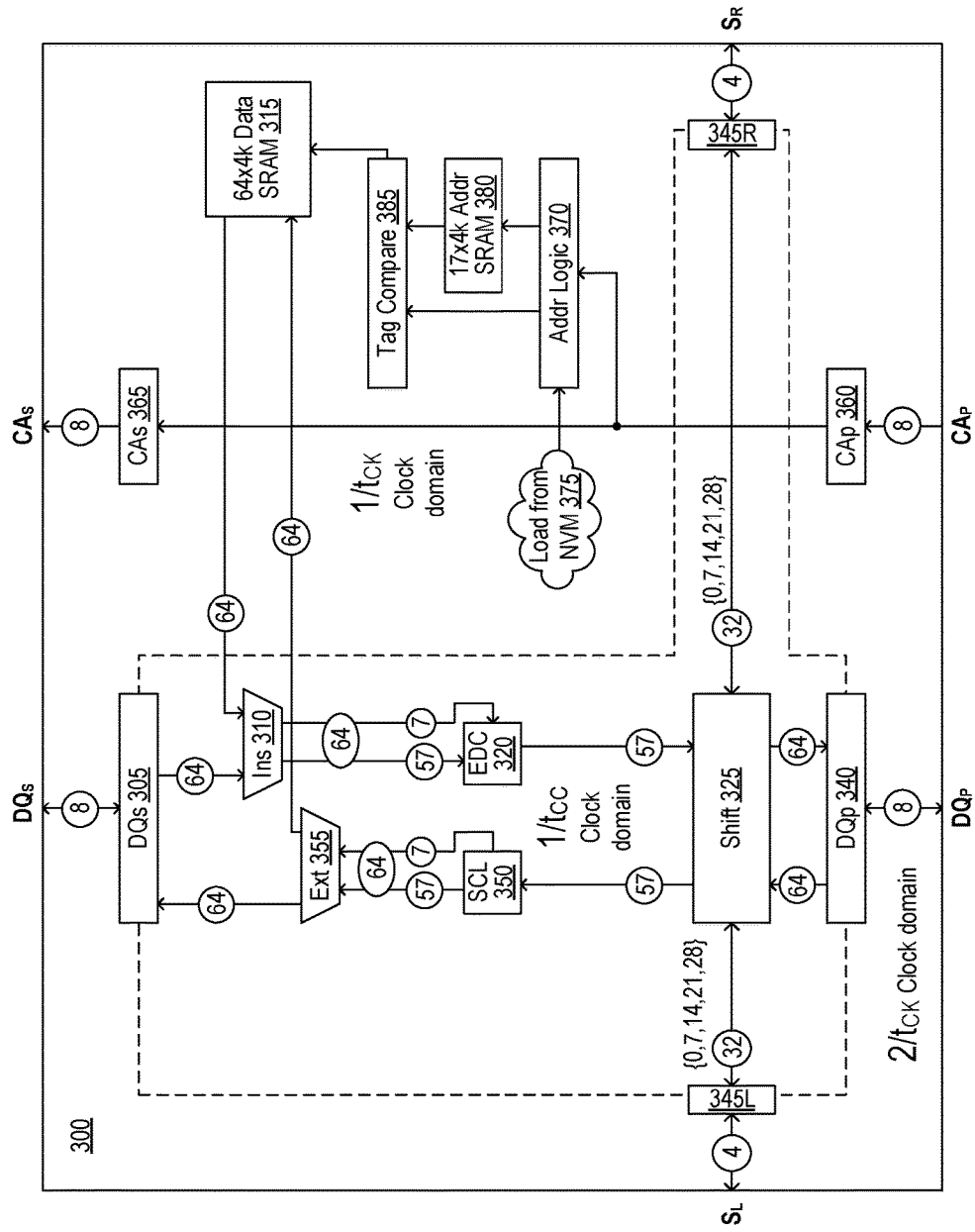
FIG. 3 diagrams an example of an EDC component 300 that can be used for each component 210A-I of FIG. 2.

FIG. 3 diagrams an example of an EDC component 300 that can be used for each component 210A-I of FIG. 2. This illustration of component 300 introduces bidirectional data signaling in support of both read and write transactions, unidirectional command signaling, and spare memory space that can be used in place of defective DRAM address locations.

EDC component 300 communicates bursts of by-eight data in both directions between ports DQs and DQp. In the read direction, a serializer/deserializer (serdes) 305 converts by-eight read data to by-sixty-four read data at a clock rate reduced by a factor of eight. Elements that operate in this reduced-rate clock domain are encompassed within a dashed boundary. The by-sixty-four read data traverses a two-to-one multiplexer 310 that can be controlled to insert data from a local SRAM 315 in lieu of the data from deserializer 305 to accommodate DRAM addresses identified as indicative of defective memory locations. This aspect of component 300 is detailed below. The by-sixty-four read data from multiplexer 310 includes fifty-seven data bits and seven syndrome bits. EDC logic 320 uses the syndrome bits to detect and correct errors in the fifty-seven data bits, producing by-fifty-seven error-corrected data.

Programmable shift logic 325 passes from zero to twenty-eight of the fifty-seven data bits to one or two adjacent EDC components and receives from zero to twenty-eight data bits from an adjacent EDC component. These programmed connections are detailed above in connection with FIG. 2. Shift logic 325 directs error-corrected data bits from EDC logic 320 and an adjacent component 300 to pass sixty-four parallel, error-corrected data bits to a serdes 340, which converts the by-sixty-four data to by-eight data. An optional pair of serdes 345L and 345R support the left and right interconnections, reducing the requisite number of connections between components 300. The lateral interconnections are hard-wired in other embodiments.

In the write direction, shift logic 325 routes by-sixty-four data from serdes 340 to syndrome-calculation logic 350 and adjacent EDC components. The connectivity is as detailed in relation to FIG. 2 in one embodiment; the data widths are the same in the write direction as for the read direction. Whatever the source or sources of the fifty-seven data bits, syndrome-calculation logic 350 generates a seven-bit syndrome from the by-fifty-seven data and directs the resulting sixty-four bits to a demultiplexer 355. Demultiplexer 355 can be controlled to store data in local SRAM 315 for data directed to defective DRAM addresses. Finally, serdes 305 serializes the data and syndrome bits and conveys them off-chip for storage.

Component 300 buffers command and address signals from a controller or processor (not shown) via an input port $CA_P$ to the associated memory (e.g., DRAM component 205 of FIG. 2) via an output port $CA_S$. A pair of serdes 360 and 365 is included to widen and slow the command and address signals for local processing.

Component 300 includes integrated memory 315 that can be used to replace defective resources in external memory. Address logic 370 can receive address information, stored locally or off-chip in some form of non-volatile memory NVM 375, specifying one or more tag values that identify defective memory resources in the DRAM module to which commands are being directed. In some embodiments, defective memory resources are identified by the local error-detection logic.

Address logic 370 compares incoming addresses against the list of tag values. For example, if during production test a failing or weak bit was identified in a specific row within the DRAM address space, the weak row address could be stored in NVM 375. Ideally, component 300 would be tasked with trying to match every row address passing from the primary side interface of serdes 360 to the secondary side interface of serdes 365, looking for transactions that match that weak row address. However, in modern DRAM modules, the row address space is fairly large, around 16 bits ($2^{16}$=65,536 row addresses per DRAM), which would require an economically impractical amount of SRAM repair memory. To reduce the size of the integrated memory 315, a tag compare approach could be used. In this approach, a portion of the most-significant bits of the weak row address are used to address a smaller amount of tag memory and the remaining least-significant bits of the weak row address are stored at that address location within the tag memory. For example, only 12 bits of the externally received 16-bits could be used to address a tag memory with $2^{12}$=4 k memory locations of 17 bits each, shown as 380 in FIG. 3. A tag compare block 385 would then match the remaining 4 least-significant bits of the externally received 16-bit address with a portion of the output of tag memory 380 to see if there is a tag match. If a 4-bit match is detected, a portion of the remaining bits of the tag memory 380 at that 12-bit address indicate the repair address for the actual repair memory 315 in FIG. 3. For example, the next 12 bits (bits 5 thru bits 16) of the 17-bit tag memory could be the address of the 4 k memory locations of the 64-bit repair memory 315, while the $17^{th}$ bit could be a one-bit valid/not-valid indicator.

Shift logic 325 is programmable so that nine physically identical IC devices can be used in e.g. module 200 of FIG. 2. Programming options can be one-time programmable, reprogrammable, or configured at start up. Many suitable programming technologies are available to and understood by those of skill in the art.

Figure 4:
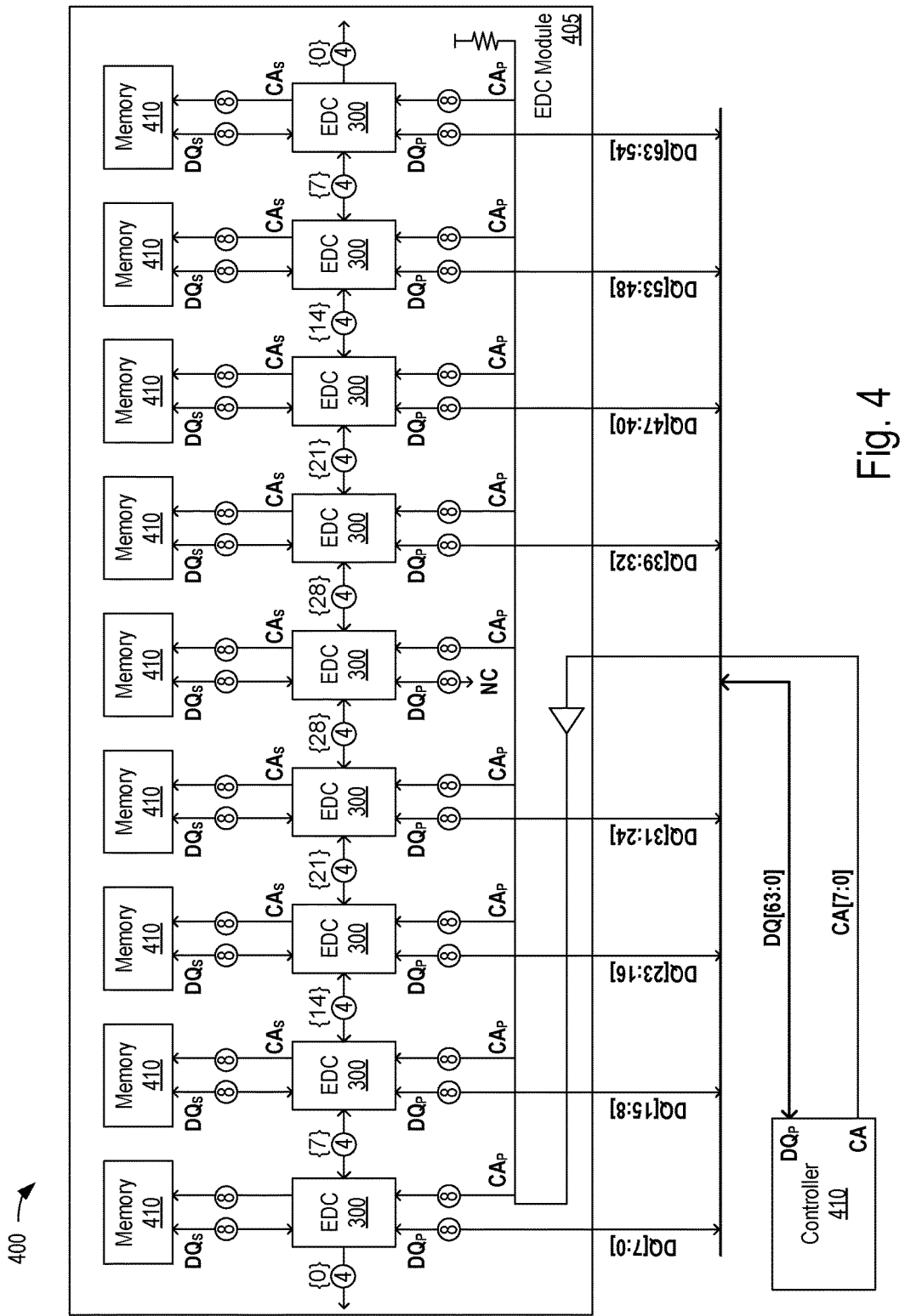
FIG. 4 depicts a memory system 400 in which an EDC memory module 405 communicates with a non-EDC controller over sixty-four parallel paths of a data bus DQ[63:0].

FIG. 4 depicts a memory system 400 in which an EDC memory module 405 communicates with a non-EDC controller over sixty-four parallel paths of a data bus DQ[63:0]. Module 405 includes nine memories 410, each of which communicates via one of nine EDC components 300 of the type detailed in connection with FIG. 3. Each memory 410 may include one or more IC devices. Each of the four-bit lateral data connections between EDC components 300 is labeled with the effective data width of the lateral connection before that data is serialized to by-four. See FIGS. 2 and 3 and the related text for a more detailed treatment of this interconnectivity.

Figure 5:
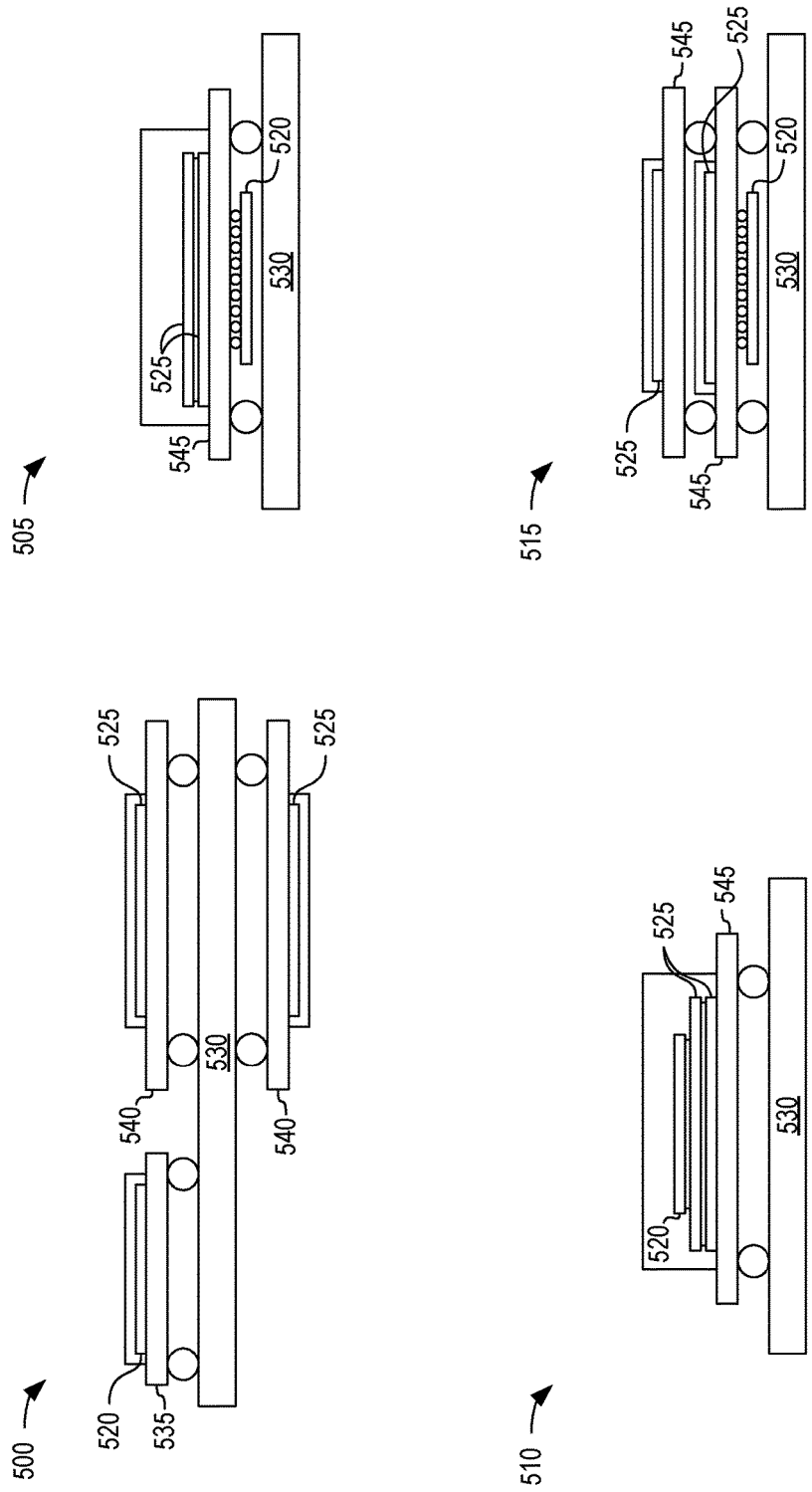
FIG. 5 depicts four memory modules 500, 505, 510, and 515 to illustrate some of the ways EDC components 520 and memory die 525 can be mounted on a module board 530.

FIG. 5 depicts four memory modules 500, 505, 510, and 515 to illustrate some of the ways EDC components 520 and memory die 525 can be mounted on a module board 530.

Beginning with module 500, one or more EDC components 520 are mounted on a PC board 535, which is in turn mounted to module board 530 via e.g. a ball-grid array. Memory dies 525 are likewise mounted on respective PC boards 540, which are in turn mounted to PC board 530. PC boards 535 and 540 provide the interconnections detailed above. Ball-Grid arrays (BGAs) are depicted for interconnecting PC boards in these examples, but different types of mounting, packaging, and interconnection techniques are available and well known to those of skill in the art.

Module 505 is similar to module 500, with like-identified elements being the same or similar. Memory dies 525 are interconnect using through-silicon vias (TSVs), and are mounted to the upper surface of a PC board 545, EDC components 520 are mounted to the lower surface of PC board 545, which is in turn mounted to module board 530.

Module 510 is similar to module 505, with like-identified elements being the same or similar. However, EDC components 520 are connected to memory dies 525 via TSV connections instead of via PC board 545.

Module 515 is similar to module 505, with like-identified elements being the same or similar. Rather than using TSVs to stack memory dies 525, each layer of dies 525 is provided in a separate package on a respective PC board 545.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of IC design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, variations of these embodiments will be obvious to those of ordinary skill in the art. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. § 112

What is claimed is:

1. A memory module comprising:
   memory components having address locations to store data signals and syndrome signals; and
   error-detection components each having:
   a first interface connected to a respective subset of the memory components to receive a respective subset of the data signals and a respective subset of the syndrome signals;
   error-detection logic to detect errors in the respective subset of the data signals using the respective subset of the syndrome signals, the error-detection logic to issue error-detected data signals, the error-detected data signals having a first portion and a second portion; and
   a second interface to combine the first portion of the error-detected data signals with the second portion of the error-detected data signals from another of the error-detection components.

2. The memory module of claim 1, further comprising a module connector coupled to the second interface of each of the error-detection components to communicate the error-detected data signals from the error-detection components to a controller.

3. The memory module of claim 2, the module connector to receive second data signals and convey subsets of the second data signals to the respective error-detection components, the error-detection components to generate respective second syndrome signals responsive to the subsets of the second data signals.

4. The memory module of claim 1, each error-detection component further having a repair memory element to substitute for at least one of the address locations of the memory components.

5. The memory module of claim 1, wherein the error-detection components comprise error-detection logic and error-correction logic, each of the error-detection components to correct the errors in the respective subset of the data signals responsive to the respective subset of the syndrome signals.

6. The memory module of claim 5, the error-detection components further having serializers to serialize the first portion of the error-detected data signals and the second portion of the error-detected data signals from the other one of the error-detection components.

7. The memory module of claim 1, further comprising data connections between the other ones of the error-detection components to communicate the second portion of the respective subset of the data signals between the other ones of the error-detection components.

8. A memory system comprising:
   a controller to communicate data of a data width as parallel data bits;
   a data bus connected to the controller to convey the data, the data bus including paths to convey the parallel data bits; and
   a memory module, coupled to the controller via the data bus, to store the data, the memory module including:
   error-detection components each having:
   a controller interface coupled to the controller via a respective subset of the paths to receive a respective subset of the data bits, the subset of the paths conveying a first portion of the subset of the data bits and a second portion of the subset of the data bits;
   a component interface coupled to another of the error-detection components to convey the second portion of the subset of the data bits to the other one of the error-detection components; and
   syndrome logic coupled to the controller interface to calculate respective syndromes for the first portion of the subset of data bits and the second portion of the subset of data bits from the other one of the error-detection components.

9. The memory system of claim 8, the error-detection components each having a memory-component interface to transmit the subsets of the data bits and the syndromes.

10. The memory system of claim 9, the memory module further including memory components each coupled to the memory-component interface of at least one of the error-detection components, the memory components to store the subsets of the data bits and the syndromes, the memory-component interface of each of the error-detection components to read the stored subsets of the data bits and the syndromes, each of the error-detection components to detect errors in respective stored subsets using respective syndromes.

11. The memory system of claim 10, wherein the error-detection components comprise error-detection logic and error-correction logic, each of the error-detection components to correct the errors in the respective stored subsets, using the respective syndromes, to produce error-corrected data, each error-detection component further including a serializer to serialize a first portion of the error-corrected data from a first of the error-detection components and a second portion of the error-corrected data from a second of the error-detection components.

12. The memory system of claim 11, wherein the first portion is of a first data width and the second portion is of a second data width different from the first data width.

13. The memory system of claim 12, wherein a ratio of the first and second data widths varies between the error-detection components.

14. The memory system of claim 10, each error-detection component further having a repair memory element to substitute for an address location of the memory components.

* * * * *